United States Patent
Asuma et al.

(10) Patent No.: US 11,680,322 B2
(45) Date of Patent: Jun. 20, 2023

(54) METHOD FOR FORMING A LAMINATED FILM ON A SUBSTRATE

(71) Applicant: DAI NIPPON PRINTING CO., LTD., Tokyo (JP)

(72) Inventors: Tatsuo Asuma, Tokyo (JP); Shigeki Matsui, Tokyo (JP); Teruhisa Komuro, Tokyo (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 111 days.

(21) Appl. No.: 15/897,498

(22) Filed: Feb. 15, 2018

(65) Prior Publication Data

US 2018/0171480 A1    Jun. 21, 2018

Related U.S. Application Data

(63) Continuation of application No. 14/367,687, filed as application No. PCT/JP2012/083927 on Dec. 27, 2012, now abandoned.

(30) Foreign Application Priority Data

Dec. 28, 2011   (JP) ................................. 2011-288690

(51) Int. Cl.
    *C23C 16/54*    (2006.01)
    *H01J 37/32*    (2006.01)
    (Continued)

(52) U.S. Cl.
    CPC .......... *C23C 16/545* (2013.01); *C23C 14/022* (2013.01); *C23C 14/562* (2013.01); *H01J 37/3277* (2013.01); *H05H 1/473* (2021.05)

(58) Field of Classification Search
    None
    See application file for complete search history.

(56) References Cited

U.S. PATENT DOCUMENTS 4,849,087 A * 7/1989 Meyer .................... C23C 14/54
                                                      204/298.03
5,224,441 A * 7/1993 Felts ..................... C23C 16/545
                                                      118/718
(Continued)

FOREIGN PATENT DOCUMENTS

EP      1 787796       5/2007
JP      62-282434      12/1987
(Continued)

OTHER PUBLICATIONS

International Search Report dated Feb. 19, 2013 in corresponding International Application No. PCT/JP2012/083927.
(Continued)

*Primary Examiner* — Karla A Moore
(74) *Attorney, Agent, or Firm* — Wenderoth, Lind & Ponack, L.L.P.

(57) ABSTRACT

A method for forming a film on a substrate by continuous vapor deposition includes: introducing the substrate into a film-forming apparatus; conveying the substrate into a pretreatment compartment of a pressure reduction chamber of the film-forming apparatus; performing plasma pretreatment of the substrate including supplying a plasma source gas composed of argon and at least one of oxygen, nitrogen, carbon dioxide gas and ethylene, introducing the plasma source gas that has been supplied as plasma into a gap between a magnet of the pretreatment compartment and a pretreatment roller such that the plasma is entrapped in the gap, and holding the plasma and applying a voltage between the pretreatment roller and a plasma-supply nozzle; conveying the substrate into a vapor deposition compartment of the pressure reduction chamber; and forming the film by vapor deposition on a surface of the substrate which has been pretreated.

9 Claims, 1 Drawing Sheet

(51) Int. Cl.
    *C23C 14/56* (2006.01)
    *C23C 14/02* (2006.01)
    *H05H 1/24* (2006.01)

(56) References Cited

U.S. PATENT DOCUMENTS

| | | | | |
|---|---|---|---|---|
| 5,302,424 | A * | 4/1994 | Murai | C23C 16/503 |
| | | | | 427/249.7 |
| 5,865,932 | A * | 2/1999 | Funabashi | G03C 1/915 |
| | | | | 118/718 |
| 6,044,792 | A | 4/2000 | Ogawa et al. | |
| 6,066,826 | A * | 5/2000 | Yializis | B29C 59/14 |
| | | | | 219/121.52 |
| 7,811,669 | B2 * | 10/2010 | Fujii | C23C 16/545 |
| | | | | 427/489 |
| 2004/0082187 | A1 * | 4/2004 | Chistyakov | H01J 37/32706 |
| | | | | 438/710 |
| 2005/0249875 | A1 | 11/2005 | Sasaki et al. | |
| 2006/0008593 | A1 | 1/2006 | Fayet et al. | |
| 2006/0150908 | A1 | 7/2006 | Fayet et al. | |
| 2006/0159844 | A1 * | 7/2006 | Moriwaki | G11B 5/851 |
| | | | | 427/127 |
| 2007/0269664 | A1 * | 11/2007 | Fujii | C23C 14/562 |
| | | | | 428/688 |

FOREIGN PATENT DOCUMENTS

| | | |
|---|---|---|
| JP | 7-102372 | 4/1995 |
| JP | 9-231563 | 9/1997 |
| JP | 11-262970 | 9/1999 |
| JP | 2000-355071 | 12/2000 |
| JP | 2001-140079 | 5/2001 |
| JP | 2004-203023 | 7/2004 |
| JP | 2004-315861 | 11/2004 |
| JP | 2006082239 A * | 3/2006 |
| JP | 2008-31492 | 2/2008 |
| JP | 2009-084642 | 4/2009 |
| JP | 2010-083776 | 4/2010 |
| WO | 03/009998 | 2/2003 |

OTHER PUBLICATIONS

English Translation of International Preliminary Report on Patentability for PCT/JP2012/083927, dated Jul. 1, 2014.
Reference List from Extended European Search Report, dated Jul. 23, 2015, from counterpart EPO Application No. 12861556.4.
Japanese Office Action dated Dec. 20, 2016, issued in corresponding Japanese application No. 20 13-551804, with partial English language translation.
Office Action dated Aug. 21, 2018 in corresponding Japanese Application No. 2013-551804, with partial English translation.
Extended European Search Report dated Oct. 9, 2020 in European Patent Application No. 20180187.5.

* cited by examiner

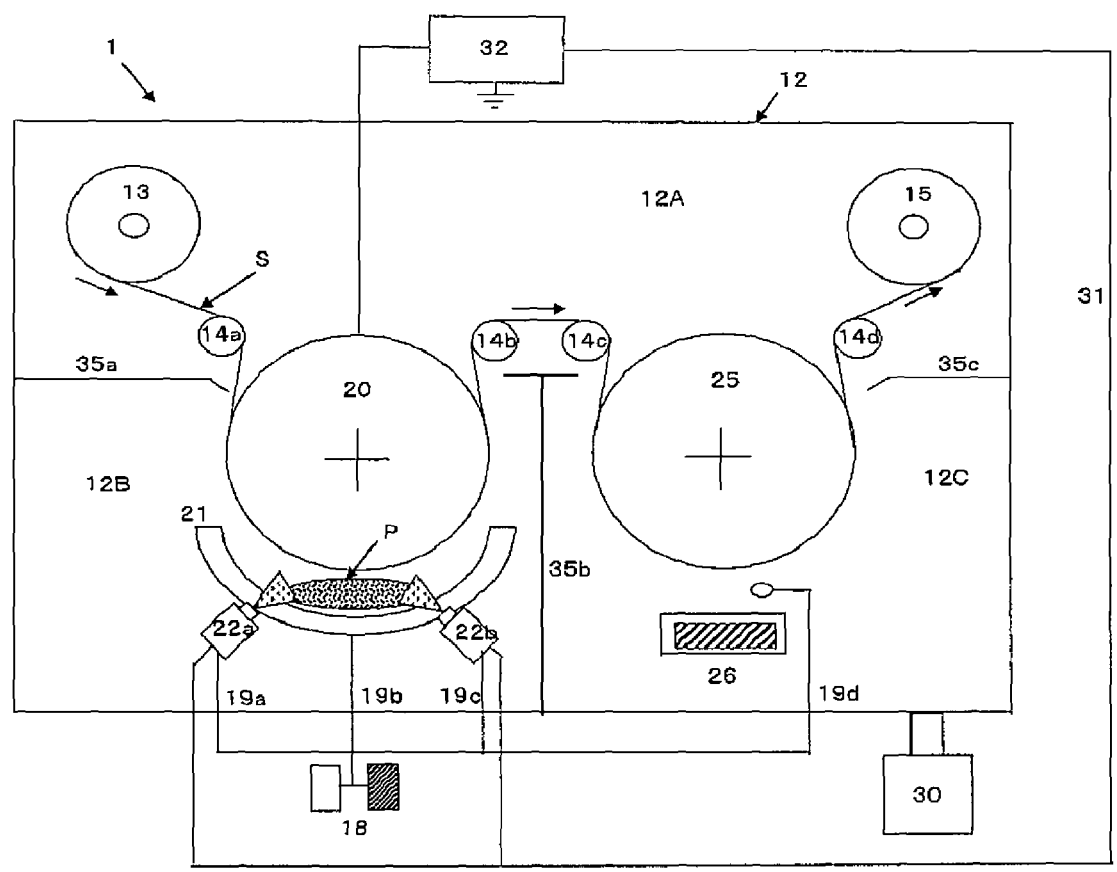

METHOD FOR FORMING A LAMINATED FILM ON A SUBSTRATE

TECHNICAL FIELD

The present invention relates to a multiple roller-type continuous vapor deposition film-forming apparatus (hereunder referred to as "film-forming apparatus"), provided with both a pretreatment roller for plasma pretreatment and a film-forming roller in series, that conveys a long substrate such as a film or sheet at high speed while continuously forming a thin-film on the substrate surface, and particularly it relates to a film-forming apparatus that stably and continuously forms a homogeneous thin-film with excellent adhesiveness on the surface of a long substrate under reduced pressure.

BACKGROUND ART

In the prior art there exist methods such as vacuum vapor deposition, sputtering, wet coating by gel-sol methods and the like, and thermal CVD, as means for continuously forming metal and metal oxide thin-films in chambers on conveyed substrates for long films or sheets of plastics or the like, and film-forming apparatuses are known that form films by sputtering or vapor deposition on the surfaces of substrates using such means.

As a specific film-forming apparatus there is known a production apparatus that accomplishes continuous film formation from a barrier layer on the surface of a traveling substrate, by taking up a film-like substrate around a film-forming roller in a vacuum chamber to convey the substrate, and supplying a source gas near the outer periphery of the film-forming roller while using the film-forming roller as one electrode to produce plasma discharge near the outer periphery of the film-forming roller, for plasma CVD (PTL 1).

Also in the vacuum chamber, the substrate that has been unwound from an unwinding roll is taken up around a film-forming roll across a guide roll at the upstream end, and is taken up by a take-up roll across a guide roll at the downstream end. There is also known a production apparatus for continuous formation of a barrier layer on the surface of a traveling substrate, in which after evacuation of the vacuum chamber interior, a sputtering gas is supplied to the prescribed gas pressure, and the substrate is conveyed from the unwinding roll to the take-up roll while accumulating film-forming particles emitted from the sputtering vaporization source on the surface of the substrate on the film-forming roll to form a film, and the film-formed substrate is taken up on a take-up roll (PTL 2).

In this type of known film-forming apparatus, the thin-film forming speed is not slow with vacuum vapor deposition, but the precision of the thin-film homogeneity is poor, and therefore the yield is notably poor. Also, in sputtering, the precision of thin-film homogeneity is satisfactory but the thin-film forming rate is very low and productivity is poor. In thermal CVD processes, a source gas is oxidized and decomposed by the heat energy of the substrate to form a thin-film, and they require the substrate to be at high temperature, such that when the substrate is a plastic film, decomposition and oxidation of the plastic film can occur, making it impossible to form a homogeneous thin-film on the plastic film substrate.

Furthermore, in known film-forming apparatuses, the thin-films formed on substrates cannot exhibit a sufficient barrier property, and adhesiveness between the thin-film and substrate is insufficient.

It has been attempted to provide a film-forming apparatus that solves the problem of forming a thin-film on a traveling substrate surface and can provide a substrate with a barrier thin-film, such as a known apparatus that performs pretreatment on a substrate surface by reactive ion etching (RIE) utilizing plasma, for production of a vapor deposition film that can improve adhesiveness between the substrate surface and vapor deposition film and can exhibit barrier performance, and forms a film of a vapor deposition layer made of a metal or inorganic oxide by vacuum vapor deposition on the pre-treated substrate surface (PTL 3).

CITATION LIST

Patent Literature

PTL 1: Japanese Unexamined Patent Application Publication No. 2001-140079

PTL 2: Japanese Unexamined Patent Application Publication No. 2008-31492

PTL 3: Japanese Unexamined Patent Application Publication No. 2004-203023

SUMMARY OF INVENTION

Technical Problem

Although continuous film formation can be accomplished with a conventional film-forming apparatus as described above, it is not possible to homogeneously form the vapor deposition film, and adhesiveness between the substrate and the vapor deposited thin-film is insufficient, while the thin-film formation speed is slow and productivity is inferior.

The present invention has been accomplished in light of the problems mentioned above, and its object is to provide a high-speed continuous film-forming apparatus that can stably form, with improved productivity, a vapor deposited thin-film that has excellent homogeneity and excellent adhesiveness between the vapor deposition film and substrate and can exhibit barrier performance, without being affected by the temperature and humidity of the vapor deposition film, even when the barrier layer is formed while conveying the substrate at high speed.

Solution to Problem

In order to achieve the aforementioned object, the invention provides a multiple roller-type continuous vapor deposition film-forming apparatus that accomplishes plasma pretreatment of a substrate on a pretreatment roller surface under reduced pressure using a plasma pretreatment device, to form a vapor deposited thin-film on the pretreated surface of the treated substrate on a film-forming roller using a vapor deposition film-forming apparatus, the roller-type continuous vapor deposition film-forming apparatus comprising a pressure reduction chamber, conveying means that conveys the substrate in the pressure reduction chamber, means that isolates the pressure reduction chamber interior into at least a pretreatment compartment and a film formation compartment, a pretreatment roller provided in the pressure reduction chamber for at least plasma treatment of the taken-up substrate, a plurality of substrate treatment rollers including a film-forming roller for film formation of a vapor deposition film on the pretreated surface of the substrate, plasma pretreatment means comprising plasma-supply means that supplies a plasma source gas composed of oxygen, nitrogen, carbon dioxide gas, ethylene or a mixture of one or more of these with argon and magnetic field-forming means, and vapor deposition film-forming means for forming a vapor deposition film on the plasma-pretreated substrate surface, the roller-type continuous vapor deposition film-forming apparatus having a construction in which the pretreatment roller is disposed with the plasma-supply means and the magnetic field-forming means facing the pretreatment roller, and the plasma source gas that has been supplied is introduced as plasma near the substrate surface and concentrated, with a gap to entrap the plasma, while it is held with a desired voltage being applied between the plasma pretreatment roller and the plasma-supply means.

It has a construction with a plasma pretreatment roller that conveys a substrate for pretreatment of the substrate surface of the plastic material or the like using low-temperature plasma, and plasma-supply means and magnetic field-forming means facing the pretreatment roller, the supplied plasma source gas is introduced as plasma near the substrate surface and concentrated, with a gap to entrap the plasma, while also having a construction with a roller-type plasma pretreatment device provided in series with the film-forming apparatus, allowing plasma pretreatment while holding it with a desired voltage being applied between the plasma pretreatment roller and the plasma-supply means.

A continuous vapor deposition film-forming apparatus comprising a plasma pretreatment device according to the invention has a magnet situated for holding powerful plasma in the treatment section in a plasma state with greater reactivity than normal, and by pretreating a substrate surface which is a plastic material or the like in a powerfully formed magnetic field, the radicals or ions generated during this time are utilized to generate functional groups on the surface and promote bonding with inorganic oxides.

Also, adhesiveness between the substrate made of a plastic material or the like and the vapor deposited thin-film made of an inorganic oxide is reinforced, which not only improves the gas barrier property and prevents cracking, but also helps prevent delamination even during heat treatment with a retort or the like. Furthermore, the treatment system is capable of treatment at high speed (480 m/min to 1000 m/min).

In the continuous vapor deposition film-forming apparatus of the invention, the pressure reduction chamber has at least a plasma pretreatment compartment in which plasma pretreatment is carried out, and a film formation compartment in which a vapor deposition film is continuously formed by any of various film-forming methods.

The pressure reduction chamber may be partitioned so as to have a substrate conveying compartment before the pretreatment chamber, after the film formation compartment, or both.

The pressure reduction chamber may also be constructed with an exhaust chamber.

The plasma pretreatment compartment divides the plasma-generated space into another region and allows efficient evacuation of the opposing space, thereby easily controlling the plasma gas concentration and improving productivity. The pretreatment pressure resulting from pressure reduction is preferably set and maintained at about 0.1 Pa to 100 Pa.

The film-forming pressure of the film formation compartment in which vapor deposition film formation is continuously carried out by a film-forming method is preferably set and maintained at about 0.1 Pa to 100 Pa in order to form a vapor deposition film having sufficient denseness of the vapor deposition film and adhesiveness with the substrate.

Also, the substrate conveying compartment or exhaust chamber is preferably set and maintained to have a higher degree of vacuum than the chamber during pretreatment, in a range of 10 to 10,000 times greater, in order to prevent the plasma in the pretreatment chamber from leaking into the substrate conveying compartment and resulting in unstable plasma discharge, and to appropriately control convey of the substrate, and also to protect the substrate conveying mechanism from damage by the plasma. Furthermore, in order to efficiently remove by-products generated on the film-formed substrate surface and avoid formation of a vapor deposition film contaminated by impurities, it is preferably in a range of 10 to 10,000 times greater than the degree of vacuum of the film formation compartment during film formation.

The plasma pretreatment device of the invention comprises plasma pretreatment means including plasma-supply means and magnetic field-forming means, and a pretreatment roller for plasma pretreatment of the substrate surface while conveying the substrate.

For plasma pretreatment, the plasma-supply means supplies a plasma source gas comprising an inert gas such as argon as a plasma source gas that does not form a coating film, and oxygen, nitrogen, carbon dioxide gas, ethylene or the like, or a mixed gas of one of more of these gas components, as an active gas component.

The plasma source gas used may be one type of inert gas and active gas, or a mixture of two or more of these gases. Preferably, a mixed gas of an inert gas such as argon and an active gas is supplied to the plasma-supply means.

The plasma-supply means is set at a position opposite the pretreatment roller and functions as a counter electrode, while a high-frequency voltage is applied between the counter electrode and pretreatment roller to form plasma, and the plasma is supplied near the supply port of the plasma-supply means with plasma being introduced into the substrate surface treatment region.

The gas supply means is mounted on the counter electrode side provided facing the pretreatment roller that conveys the substrate, and it supplies gas toward the substrate surface. The gas supply means may be on an electrically floating level.

The magnetic field-forming means forms a magnetic field in order to create concentrated plasma and hold the plasma while facilitating discharge, and a magnet is set at a location opposite the pretreatment roller in the plasma pretreatment compartment. The magnetic field-forming means is set so as to combine the use of the counter electrode and plasma-supply means with the magnet, for suitable concentration of the plasma in an efficient manner on the substrate surface.

The magnet is not particularly restricted, and for example, it may be a ferrite magnet, or a rare earth magnet such as neodymium or samarium cobalt (SamCo). It is not limited to being a permanent magnet, and may instead be an electromagnet.

The plasma pretreatment means of the invention is configured so that a limited and surrounded gap is formed by the counter electrode/plasma-supply means and magnetic field-forming means composing the plasma pretreatment means, and the pretreatment roller, in order to create plasma from the supplied plasma source gas and form plasma in a concentrated manner near the substrate being conveyed over the surface of the plasma pretreatment roller.

The plasma pretreatment means encloses plasma in the space of the gap, increasing the plasma density and forming a plasma pretreatment region on the substrate surface in a controllable manner.

The plasma power source applies an alternating current voltage with a frequency of from 10 Hz to 50 MHz between the counter electrode, with the plasma pretreatment roller set as the ground level, and accomplishes input power control or impedance control.

The plasma pretreatment roller may be set on the electrical ground level, or it may be set on the electrical floating level.

According to the invention, a power source is connected between the plasma pretreatment roller and the plasma-supply means, forming a condition in which a desired voltage is applied between them, and a pulse voltage of 200-1000 volts as the applied voltage is applied to the power source.

By superposing a direct-current voltage with a negative voltage of minus several hundred volts with the applied pulse voltage it is possible to perform maintenance of the electrode surface in the plasma, and this improves the power efficiency while allowing efficient plasma pretreatment to be accomplished.

According to the invention, the flux density by the magnetic field-forming means is from 100 gauss to 10,000 gauss, and application of a magnetic field to the plasma encloses the plasma near the substrate surface, which when held there has inhibited loss due to exhaust and seal leakage at the partitions, allowing pretreatment to be carried out at high efficiency.

A plasma power source is supplied to the counter electrode side in the plasma pretreatment device, but there is no limitation to this, and a plasma power source may instead be applied only to the plasma pretreatment roller, or the plasma power source may be supplied to both the plasma pretreatment roller and the counter electrode. Also, the magnet is shown placed on the counter electrode side in the attached drawings, but this is not limitative, and the magnet may instead be placed only at the plasma pretreatment roller, or the magnet may be placed at both the pretreatment roller and the counter electrode.

The vapor deposition film-forming apparatus of the invention forms a vapor deposition film on the plasma-pretreated substrate surface that is conveyed at high speed on the pretreatment roller surface in the plasma pretreatment device, and the method of vapor deposition for film formation of the vapor deposition film may be any of various vapor deposition methods such as physical vapor deposition or chemical vapor deposition.

The physical vapor deposition method may be selected from the group consisting of vapor deposition, sputtering, ion plating, ion beam assist and cluster ion beam methods, or it may be selected from the group consisting of plasma CVD, plasma polymerization, thermal CVD and catalyst reaction CVD methods.

The film-forming apparatus comprises a film-forming roller that is set in a reduced pressure film formation compartment and takes up and conveys a substrate that has been pretreated with a plasma pretreatment device, with the treated side of the substrate facing outward, and performs film-forming treatment, and also vapor deposition film-forming means such as a vapor deposition film-forming apparatus, sputtering film-forming apparatus, ion plating film-forming apparatus, ion beam assist film-forming apparatus, cluster ion beam film-forming apparatus, plasma CVD film-forming apparatus, plasma polymerization film-forming apparatus, thermal CVD film-forming apparatus or catalyst reaction CVD film-forming apparatus, that vaporizes a film formation source target set opposite the film-forming roller to form a vapor deposition film on the substrate surface.

The film-forming apparatus of the invention may employ various physical vapor deposition apparatuses by exchanging the vaporizing means for the film formation source target, or it may also have a construction allowing film formation by a chemical vapor deposition apparatus, and various film-forming methods may be used.

The film-forming means may be a single film-forming apparatus, or two or more of the same or different film-forming apparatuses in combination.

For example, when a thin-film is to be formed to a high thickness with a single film-forming apparatus, the thin-film becomes fragile due to stress and cracking is generated, notably lowering the gas barrier property or causing detachment of the thin-film during conveyance or during take-up, and therefore a plurality of film-forming apparatuses may be provided to obtain a thick layer of the barrier thin-film, for multiple formation of thin-films of the same substance. In addition, a plurality of film-forming apparatuses may be used to form thin-films of different materials, in which case it is possible to obtain a multilayer film imparted with not only a barrier property but also various other functions.

The substance forming the vapor deposited thin-film is not particularly restricted, but when it is to be used as a barrier thin-film, it may be a metal oxide such as silicon oxide, silicon nitride, silicon oxynitride, silicon carbide, aluminum oxide, magnesium oxide, titanium oxide, tin oxide, indium oxide, zinc oxide or zirconium oxide, or nitrides or carbides of these metals, or mixtures of the foregoing.

The film-forming roller is formed of a material comprising at least one from among stainless steel, iron, copper and chromium, and the film-forming roller preferably has a surface average roughness Ra of between 0.1 μm and 10 μm.

The film-forming roller may be further provided with temperature-adjusting means that keeps the film-forming roller at a constant temperature between −20° C. and 200° C. The film-forming roller may also be provided with insulating regions at both ends. The insulating regions are formed of one or more oxide films, nitride films or oxynitride films of Al, Si, Ta, Ti, Nb, V, Bi, Y, W, Mo, Zr or Hf. Also, the insulating regions are covered with a compact, tape or coating film made of polyimide resin, fluorine resin or mica.

A substrate charge-remover that removes charge from the substrate generated by film formation in the substrate conveying compartment at a later stage than the film formation compartment, may be provided on one or both surfaces of the substrate.

The post-treatment device used as the charge-remover may be any desired processing device such as, for example, a plasma discharge device, electron beam irradiation device, ultraviolet irradiation device, charge-removing bar, glow discharge device or corona treatment device.

When discharge is to be formed using a plasma treatment device or glow discharge device as electrostatic treatment, a discharge gas such as argon, oxygen, nitrogen or helium may be supplied alone or as a mixture near the substrate, and any desired discharge system such as alternating current (AC) plasma, direct current (DC) plasma, arc discharge, microwave, surface wave plasma or the like may be used. Most preferred is an electrostatic treatment method using a plasma discharge apparatus in a reduced pressure environment.

By setting the post-treatment device in a substrate conveying compartment in a stage after the film formation compartment and eliminating the charge from the substrate, the substrate may be rapidly removed from the film-forming roller at a prescribed location and conveyed, allowing the substrate to be stably conveyed, and it is possible to prevent damage to the substrate or loss of quality due to electrification and obtain improved suitably for post-processing by improved wettability of the front and back sides of the substrate.

Advantageous Effects of Invention

The roll-type continuous vapor deposition film-forming apparatus of the invention has a pretreatment roller provided in a pressure reduction chamber, that performs at least plasma treatment of a taken-up substrate, as pretreatment of a substrate that has been carried out in the prior art, and plasma pretreatment means comprising plasma-supply means that supplies plasma gas comprising oxygen, nitrogen, carbon dioxide gas and ethylene, or a mixed gas of one or more of these with argon, and magnetic field-forming means, situated so as to concentrate the supplied plasma gas near the substrate surface in a concentrated manner, with an enclosing gap being formed, and by application of a prescribed voltage between the plasma pretreatment roller and plasma-supply means, it is possible to rapidly and stably form a homogeneous thin-film continuously on a long substrate with excellent adhesiveness on the substrate surface.

According to the invention, in the plasma pretreatment device there is situated plasma pretreatment means in such a manner that the supplied plasma mixed gas is concentrated near the substrate surface being conveyed on the pretreatment roller surface, with an enclosing gap being formed, and by conducting plasma pretreatment with a desired voltage actively applied between the substrate and the plasma-supply means, it is possible to control the plasma density of the pretreatment plasma as desired, to reliably and effectively implant the plasma onto the substrate surface during pretreatment, and physically or chemically modify the surface properties of the substrate, while helping to improve adhesiveness between the vapor deposited thin-film and substrate in the film formation step to allow continuous treatment, which as a result can reduce detachment of the vapor deposited thin-film.

Also, since the roller-type continuous vapor deposition film-forming apparatus of the invention is a roller-type continuous vapor deposition film-forming apparatus comprising a plasma pretreatment device as a roll-to-roll type with the pretreatment roll and forming roll installed in series, it is possible to accomplish continuous and stable conveyance from pretreatment to film formation, while the substrate can be conveyed at higher speed than the conventional conveying speed and film-forming treatment of the vapor deposition film can be accomplished at high speed, so that the film-forming speed can therefore be increased, i.e. productivity improved, while having a low plasma output.

According to the invention, plasma pretreatment is carried out by using plasma-supply means to supply plasma with increased reactivity that is argon plasma as an inert gas using a plasma-forming gas that does not form a film, and active gas plasma, and the reactive plasma is supplied into a limited gap formed by a pretreatment roll, plasma-supply means and magnetic field-forming means, to allow concentration of the plasma near the substrate surface, allowing effective activation of the substrate surface by pretreatment while allowing film-forming treatment of the vapor deposition film to be accomplished even when the substrate is conveyed at higher speed than the conventional conveying speed, and effectively making use of the activated surface to allow reinforcement of adhesiveness between the vapor deposition film and substrate surface.

Since the invention can also increase dense formation of the vapor deposition film and adhesiveness of the vapor deposition film, that is seen with reduced water vapor transmittance and higher laminated strength, this allows production at higher speed than in the prior art and allows continuous and stable production of a vapor deposition film with excellent adhesiveness and excellent barrier performance.

The invention further allows membrane stress to be reduced and damage to the substrate to be reduced (minimizing electrical charge-up, reducing substrate etching and reducing substrate coloration).

Furthermore, since it is not necessary to consider variation in impedance by the substrate according to the invention, there is no need to optimize the film formation conditions for different types of substrates. In addition, the placement and form of the electrodes allows adjustment in the size of impedance as necessary.

According to the invention, discharge impedance is increased by widening the distance between electrodes that are situated as a pair. As a result, with application of constant power, the discharge voltage of the film formation is high and the discharge current is low, such that the ion implantation effect is increased and a highly adhesive film can be formed.

Furthermore, by narrowing the distance between electrodes situated as an opposing pair the discharge impedance is reduced, and when the applied power is constant, the discharge voltage is low and the discharge current is high, allowing increased film-forming speed (increased productivity), reduced film stress, and less damage to the substrate (minimized electrical charge-up, increased adhesiveness due to less substrate etching, and reduced substrate coloration).

The present invention can thus adjust the ion implantation effect on substrates, increase film adhesiveness, reduce damage to substrates and form satisfactory films.

BRIEF DESCRIPTION OF DRAWINGS

FIG. 1 is a diagram showing a continuous vapor deposition film-forming apparatus according to an embodiment of the invention.

DESCRIPTION OF EMBODIMENTS

A film-forming apparatus according to an embodiment of the invention will now be described in detail with reference to the accompanying drawings. This example is merely for illustration and is not intended to limit the invention in any way.

FIG. 1 is a diagram schematically showing the overall construction of a roller-type continuous vapor deposition film-forming apparatus 1 according to an embodiment of the invention.

As shown in FIG. 1, the roller-type continuous vapor deposition film-forming apparatus 1 of the invention has partitions 35a-35c formed in a pressure reduction chamber 12. The partitions 35a-35c form a substrate conveying compartment 12A, a plasma pretreatment compartment 12B and a film formation compartment 12C, and particularly they form a plasma pretreatment compartment 12B and a film formation compartment 12C as spaces surrounded by the partitions 35a-35c, with each chamber having an exhaust chamber formed therein if necessary.

In the plasma pretreatment compartment 12B, the substrate S to be pretreated is conveyed, with the plasma treatable section of the plasma pretreatment roller 20 being exposed into the substrate conveying compartment 12A, and the substrate S is taken up while being transferred from the substrate conveying compartment 12A into the plasma pretreatment compartment 12B.

The plasma pretreatment compartment 12B and film formation compartment 12C are provided in contact with the substrate conveying compartment 12A, so that the substrate S can be transferred without contacting air. The pretreatment chamber 12B and the substrate conveying compartment 12A are connected by a rectangular hole, a section of the plasma pretreatment roller 20 protruding out through the rectangular hole toward the substrate conveying compartment 12A side, and a gap is opened between the walls of the conveying chamber and the pretreatment roller 20, the substrate S being transferable from the substrate conveying compartment 12A to the film formation compartment 12C through the gap. The same structure is provided between the substrate conveying compartment 12A and the film formation compartment 12C, allowing the substrate S to be transferred without contacting air.

The substrate conveying compartment 12A is provided with a take-up roller as take-up means for taking up into a roll form the substrate S on which the vapor deposition film has been formed on one side and that has been transferred back into the substrate conveying compartment 12A by the film-forming roller 25, and this allows the vapor deposition film-formed substrate S to be taken up.

In the pressure reduction chamber 12 there is provided a vacuum pump via a pressure-adjusting valve, and it can reduce the pressure throughout the entire substrate conveying compartment 12A, plasma pretreatment compartment 12B and film formation compartment 12C that are divided by the partitions 35a-35c.

In the plasma pretreatment compartment 12B surrounded by the partitions 35a, 35b there is further provided a vacuum pump via a pressure-adjusting valve, and either via an exhaust chamber or without it, and it allows control of the plasma pretreatment conditions and control of inflow of the plasma P into the other chambers. Similarly, a vacuum pump is also provided in the film formation compartment 12C surrounded by the partitions 35b, 35c, via a pressure-adjusting valve.

The vacuum pump used as reduced pressure evacuation means may be a dry pump, turbo-molecular pump, cryopump or the like, and adjustment of the evacuating performance and the aperture of the pressure-adjusting valve allows the pressure reduction degree to be set as desired, up to $9.0 \times 10^{-3}$ Pa.

In the substrate conveying compartment 12A, there are provided a wind-out roll 13, a take-up roller and guide rolls 14a-14d, as conveying means.

A plasma pretreatment roller 20 is situated straddling the substrate conveying compartment 12A and the plasma pretreatment compartment 12B, and guide rolls 14a-14d are provided between the wind-out roll 13 and the plasma pretreatment roller 20.

Also, a film-forming roller 25 is situated in the film formation compartment 12C, and guide rolls 14a-14d are provided between the plasma pretreatment roller 20 and the film-forming roller 25 and between the film-forming roller 25 and the take-up roller, forming a film formation conveying pathway by the group of rollers.

The substrate film formation conveying pathway may also be provided with a tension pickup roller if necessary, allowing conveyance while adjusting the tension.

If the substrate S supply roll is attached to the wind-out roll 13 in the pressure reduction chamber 12, and set along the pathway from winding out of the substrate S to the take-up roller, the substrate S can be freely wound out allowing film-forming treatment to be carried out with the film-forming apparatus.

The thickness of the substrate is preferably 6 to 100 μm. If the thickness of the substrate is within this range, it will be easily bendable and manageable with the continuous vapor deposition film-forming apparatus of the invention, without tearing during conveyance.

The substrate conveying speed is not particularly restricted, but from the viewpoint of allowing high-speed film-forming treatment and increasing production efficiency, it is at least 200 m/min and preferably from 480 m/min to 1000 m/min according to the invention.

In the plasma pretreatment compartment 12B there is provided a plasma pretreatment device comprising a pretreatment roller 20 for plasma pretreatment of the conveyed substrate S, and plasma pretreatment means for pretreatment of the substrate S on the pretreatment roller.

The plasma pretreatment roller 20 serves to prevent shrinkage or damage of the substrate S by heat during plasma treatment by the plasma pretreatment means, and to apply the plasma P to the substrate S in a uniform manner across a wide region.

The pretreatment roller 20 has temperature-adjusting means inside it, and specifically, tubing is provided for circulation of a temperature-adjusting medium such as a refrigerant or heating medium for temperature control of the pretreatment roller 20.

The pretreatment roller 20 is preferably adjustable to a constant temperature between −20° C. and 100° C. by adjusting the temperature of the temperature-adjusting medium circulating in the pretreatment roller. Electrical insulators are provided on both sides of the center section of the roller main body and around the rotating shaft, and the substrate S is taken up at the center section of the roller main body.

The pretreatment roller 20 is installed at an electrical ground level. When the pretreatment roller has been set at a ground level, the electrical charge accumulated on the surface of the substrate S is open to the ground level, allowing stable film formation as a result. In this case, a metal conducting material can be used for the roller main body, rotating shaft, bearing or roller support.

Also, the pretreatment roller 20 may be set at an electrical floating level, i.e. an insulating potential. If the potential of the pretreatment roller 20 is at a floating level, it will be possible to prevent leakage of electric power, the input power for plasma pretreatment can be increased, and utilization efficiency for pretreatment will be high.

If the pretreatment roller is at an electrical floating level, it will be possible to install a mechanism for applying a direct current potential to the pretreatment roller and reinforcing or weakening the implantation effect of the plasma P on the substrate S. In order to increase the plasma implantation effect, it is preferred to impart a minus potential to the substrate S, and in order to weaken the plasma implantation effect it is preferred to impart a plus potential to the substrate S.

By performing such adjustment, the plasma implantation effect into the substrate S can be adjusted, damage to the substrate S can be reduced, and conversely the adhesion rate of film onto the substrate S can be reinforced.

The pretreatment roller 20 is formed of a material comprising at least one from among stainless steel, iron, copper and chromium. The surface of the pretreatment roller may be subjected to chromium hard coat treatment for damage prevention. These materials are easy to process, and provide satisfactory thermal conductivity for the pretreatment roller itself, and therefore when carrying out temperature control the temperature control property is excellent.

The plasma pretreatment means comprises plasma-supply means and magnetic field-forming means. These cooperate with the plasma pretreatment roller 20 and enclose the plasma P near the surface of the substrate S, and by changing the shape of the surface of the substrate, the chemical bonded state and functional groups, it is possible to alter the chemical properties and increase adhesiveness between the substrate and the vapor deposited thin-film formed on the substrate during film formation in subsequent steps.

The plasma pretreatment means is provided covering a portion of the pretreatment roller 20. Specifically, the plasma-supply means and magnetic field-forming means composing the plasma pretreatment means are placed along the surface near the outer periphery of the pretreatment roller 20, and are placed so that a sandwiched gap is formed by the plasma-supply means having a pretreatment roller 20 and plasma supply nozzles 22a, 22b that supply plasma source gas and comprise electrodes that generate plasma P and the magnetic field-forming means having a magnet 21 to promote generation of plasma P. Thus, plasma supply nozzles 22a, 22b open into the space of the gap to create a plasma-forming region and form regions with high plasma density near the surface of the pretreatment roller 20 and substrate S, thereby forming a plasma treatment surface on one side of the substrate.

The plasma-supply means of the plasma pretreatment means comprises a starting material volatilizing and supply apparatus 18 connected to a plasma supply nozzle provided on the exterior of the pressure reduction chamber 12, and source gas-supply nozzles 19a-19d that supply a source gas from the apparatus. The supplied plasma source gas is oxygen, nitrogen, carbon dioxide gas or a mixed gas comprising one or more of these gases and an inert gas such as argon, supplied from a gas reservoir at a gas flow rate measured by a flow rate controller.

The supplied gases are mixed in a prescribed proportion to form a mixed gas for plasma formation, and supplied to the plasma-supply means. The mixed gas is supplied to the plasma supply nozzles 22a, 22b of the plasma-supply means, the supply ports of the plasma supply nozzles 22a, 22b being supplied near the outer periphery of the pretreatment roller 20 where the supply port is open. The nozzle opening is directed toward the substrate S on the pretreatment roller 20 allowing plasma P to be uniformly diffused and supplied on the substrate surface, so that homogeneous plasma pretreatment can be accomplished on a large-area section of the substrate.

The plasma supply nozzles 22a, 22b are designed to have electrode functions, functioning as counter electrodes against the ground electrode of the pretreatment roller 20, and by the potential difference produced by high-frequency voltage supplied between them and the pretreatment roller 20, the supplied plasma source gas is brought to an excited state and plasma P is generated and supplied.

Also, the plasma-supply means is provided with a power source 32 that can apply a desired voltage to the plasma pretreatment roller 20, and that can apply a bias voltage for conversion to a positive potential of the plasma P that is capable of physical or chemical modification of properties of the surface of the substrate.

Such plasma-supply means is capable of supplying the plasma P near the outer periphery of the pretreatment roller 20 to the desired density, and it can increase the power efficiency of the plasma pretreatment.

The plasma density used for the invention is between 100 and 8000 W·sec/m$^2$, and at 50 W·sec/m$^2$ or lower there is no effect of plasma pretreatment, while at 4000 W·sec/m$^2$ or higher the substrate will tend to undergo degradation by plasma, such as ablation, breakage, coloration or burning.

The plasma pretreatment means has magnetic field-forming means. The magnetic field-forming means has an insulating spacer and base plate provided in a magnet case, with a magnet 21 in the base plate. An insulating shield plate is provided in the magnet case, with an electrode being attached to the insulating shield plate.

Therefore, even when the magnet case and electrode are electrically insulated, the magnet case is placed and anchored in the pressure reduction chamber 12, the electrode can be at an electrical floating level.

Power supply wiring 31 is connected to the electrode, the power supply wiring 31 also being connected to the power source 32. A temperature-adjusting medium tube is also provided inside the electrode to cool the electrode and magnet 21.

The magnet 21 is provided to concentrate the plasma P from the plasma supply nozzles 22a, 22b serving as electrode/plasma-supply means, on the substrate S. By providing the magnet 21, it is possible to increase reactivity near the substrate surface and to rapidly form a satisfactory plasma pretreatment surface.

The magnet 21 has a flux density of between 10 gauss and 10,000 gauss at the location of the surface of the substrate S. If the flux density at the substrate surface is at least 10 gauss it will be possible to adequately increase the reactivity near the substrate surface, and to rapidly form a satisfactory pretreated surface. On the other hand, an expensive magnet or magnetic field-generating mechanism is necessary in order to increase the flux density at the substrate surface to higher than 10,000 gauss.

The configuration and shape of the electrode magnet 21 is such that, since the ions and electrons formed during plasma pretreatment move according to the configuration and shape, the electrons, ions or substrate decomposition product evenly diffuse across the entire electrode surface even when plasma pretreatment is carried out on a substrate with a large area of 1 m$^2$ or greater, to allow homogeneous and stable pretreatment even when the substrate has a large area.

Furthermore, the invention eliminates local bias in the electrode unit including the electrode and magnet 21, and consequent accumulation of thermions and ions, and this allows inexpensive fabrication of parts since the heat resistance of the structural members can be low, while problems such as heat deformation or perforation or cracking of structures can be minimized.

The electrode is preferably made using a material that is conductive for introduction of electric power, has excellent plasma resistance and heat resistance, has high cooling efficiency by cooling water (high thermal conductivity), is a non-magnetic material and has excellent workability.

Specifically, aluminum, copper and stainless steel are suitable for use.

The insulating shield plate is preferably made using a material that is insulating, has excellent plasma resistance, and has heat resistance and excellent workability. Specifically, fluorine resins and polyimide resins are suitable for use.

The present invention has guide rolls 14a-14d provided in the substrate conveying compartment 12A for subsequent introduction of the substrate S having a plasma-treated surface formed on one side, that has been moved back into the substrate conveying compartment 12A by the plasma pretreatment roller 20, into the film formation compartment 12C. It is conveyed from the substrate conveying compartment 12A to the film formation compartment 12C.

(Vapor Deposition Film-Forming Apparatus)

In the film formation compartment 12C there is provided a vapor deposition film-forming apparatus comprising a film-forming roller 25 and vapor deposition film-forming means 26. The film-forming means of the vapor deposition film-forming apparatus performs pretreatment with plasma pretreatment means and forms a vapor deposition film on the pretreated surface of the substrate that has the plasma-treated surface formed on one side, so that a vapor deposition film is formed on one side of the substrate.

The vapor deposition film-forming means 26 used may be a physical vapor deposition apparatus such as a resistance heating vacuum film-forming apparatus, sputtering apparatus, ion plating film-forming apparatus, ion beam assist film-forming apparatus, cluster ion beam film-forming apparatus or the like, or a chemical vapor deposition apparatus such as a plasma CVD film-forming apparatus, plasma polymerization film-forming apparatus, thermal CVD film-forming apparatus or catalyst reaction-type CVD film-forming apparatus.

Here, when a vacuum film-forming apparatus is used as the vapor deposition film-forming means 26, the vapor deposition film-forming means may be one having an aluminum metal material filled into a crucible as the vaporization source and heated to high temperature, the aluminum metal vapor being aluminum metal vapor that has been oxidized by introduction of oxygen gas supplied from gas supply means to the aluminum metal vapor, to form an aluminum oxide film on the substrate surface.

When the vapor deposition film-forming means 26 employs resistance heating, an aluminum wire may be used for oxidation of the aluminum metal vapor in the same manner while forming a film on the substrate surface. The vaporization source for film formation may be a sputter vaporization source, arc vaporization source or a plasma CVD film formation mechanism such as a plasma generation electrode or source gas-supplying means.

In the film formation compartment there may be provided a single film-forming apparatus, or two or more of the same or different film-forming apparatuses.

The thickness of a vapor deposited thin-film formed by a single film-forming apparatus is preferably 7 to 200 nm and more preferably 10 to 50 nm.

When a thin-film is to be formed to a high thickness with a single film-forming apparatus, the thin-film becomes fragile due to stress and cracking is generated, notably lowering the gas barrier property or causing detachment of the thin-film during conveyance or during take-up. A plurality of film-forming apparatuses may therefore be provided to obtain a thick layer of the barrier thin-film, for multiple formation of thin-films of the same substance.

In addition, a plurality of film-forming apparatuses may be used to form thin-films of different materials, in which case it is possible to obtain a multilayer film imparted with not only a gas barrier property but also various other functions.

The substance forming the thin-film is not particularly restricted, but when it is to be used as a gas barrier thin-film, it may be a metal oxide such as silicon oxide, silicon nitride, silicon oxynitride, silicon carbide, aluminum oxide, magnesium oxide, titanium oxide, tin oxide, indium oxide, zinc oxide or zirconium oxide, or a nitride or carbide of these metals, or a mixture of the foregoing.

The film-forming roller 25 is formed of a material comprising at least one from among stainless steel, iron, copper and chromium. The surface of the film-forming roller 25 may be subjected to chromium hard coat treatment for damage prevention. These materials are easy to process, and provide satisfactory thermal conductivity for the film-forming roller 25 itself, and therefore when carrying out temperature control the temperature control property is excellent.

The surface of the film-forming roller 25 of the film-forming apparatus is preferably as flat as possible. The film-forming roller 25 has a temperature-adjusting mechanism that can be set to a constant temperature of between −20° C. and 200° C. by using a cooling medium and/or heat source medium or a heater.

The film-forming roller 25 can minimize variation in the temperature of the substrate S by heat generated during film formation by the temperature-adjusting mechanism. Specifically, an ethylene glycol aqueous solution may be used as a cooling medium (refrigerant) or silicon oil may be used as a heat source medium (heating medium), and the temperature adjusted by circulating it in the film-forming roller 25, with a heater placed at a location facing the film-forming roller 25.

In a vapor deposition film-forming apparatus it is particularly preferred for the preset temperature to be set to a constant temperature of between −20° C. and 100° C., from the viewpoint of heat resistance restrictions on the related mechanical parts and for general purpose use.

The operation of the continuous vapor deposition film-forming apparatus will now be explained.

A roll-shaped substrate S supply roll is set on the wind-out roller 13 in a substrate conveying compartment 12A, and a vacuum pump is used to reduce the pressure in the substrate conveying compartment 12A and in the plasma pretreatment compartment and film formation compartment 12C.

After the pressure has been reduced to the prescribed pressure, the substrate S is wound out from the substrate supply roll by the wind-out roller 13, the substrate S is directed to the plasma pretreatment device via the guide roller 14a, and the substrate S is taken up onto the pretreatment roller 20 for plasma pretreatment, whereby the substrate S is transferred from the substrate conveying compartment 12A to the pretreatment chamber 12B.

The substrate S taken up on the pretreatment roller 20 has a plasma pretreated surface formed by the plasma pretreatment means on one side.

The substrate S with the plasma pretreated surface formed on one side is conveyed back to the substrate conveying compartment 12A by being wound around the guide roller 14b from the pretreatment roller 20. Next, the substrate S is transferred from the guide roll 14b, 14c into the substrate conveying compartment 12A, and taken up onto the film-forming roller 25 with the plasma treated side facing outward, thereby being conveyed into the film formation compartment 12C. On the substrate S, a vapor deposition film is formed by vapor deposition film-forming means 26 on the pretreated surface of the substrate S in the film formation compartment 12C.

The substrate S with the vapor deposition film formed in this manner is conveyed back to the substrate conveying compartment 12A from the film-forming roller 25, and taken up as a roll by a take-up roller via the guide roller 14d.

Thus, according to this embodiment of the roller-type continuous vapor deposition film-forming apparatus of the invention, the substrate S prior to formation of the vapor deposition film is situated on a pretreatment roller in a gap formed near the outer periphery of the pretreatment roller 20 by the pretreatment roller 20 and the plasma-supply means and magnetic field-forming means 21, and plasma P is introduced from the plasma supply nozzles 22a, 22b toward the substrate S in the gap for plasma pretreatment with a positive applied voltage applied between the plasma P and the pretreatment roller 20, and therefore the atmosphere in the plasma pretreatment means is improved and a homogeneous and high-quality plasma pretreatment surface is obtained, and it is possible to obtain a substrate having a homogeneous vapor deposition film with excellent adhesiveness by the vapor deposition barrier film formed by the subsequent vapor deposition film-forming means 26.

The substrate conveying compartment 12A has a different pressure than the plasma pretreatment compartment in which the electrode resides, by being partitioned with the partition 35a (zone seal). By forming spaces in the substrate conveying compartment 12A and pretreatment chamber 12B with different pressures, this eliminates plasma discharge of the pretreatment chamber 12B from becoming unstable due to leakage of the plasma P in the pretreatment chamber into the substrate conveying compartment 12A, or damage to the members of the substrate conveying compartment 12A, and electrical damage to the electrical circuits that serve to control the substrate conveying mechanism, which can lead to control failures, and as a result stable film formation and conveying of the substrate can be accomplished.

Specifically the plasma treatment pressure of the pretreatment chamber 12B is between 0.1 Pa and 100 Pa. By conducting pretreatment at such a pretreatment pressure, it is possible to form stabilized plasma P.

The plasma pretreatment of the invention avoids electrical coupling, without forming a film with the substrate on an electrode, and therefore it is possible to prevent increase in impedance of plasma discharge, allowing easier formation of plasma P and allowing stabilized discharge and plasma treatment for prolonged periods.

In addition, since the discharge impedance of the plasma P does not increase, it is possible to accomplish plasma treatment with a greater processing speed, reduced film stress, and less damage to the substrate (minimized electrical charge-up, reduced substrate etching and reduced substrate coloration).

The plasma pretreatment of the invention thus allows discharge impedance to be optimized, and can adjust the ion implantation effect onto the substrate and increase adhesiveness of the pretreated surface, while reducing damage to the substrate and forming a satisfactory pretreated surface.

A preferred embodiment of a continuous vapor deposition film-forming apparatus comprising a plasma pretreatment device according to the invention was described above with reference to the accompanying drawings, but the invention is not limited to this example. The invention may of course incorporate various modifications and alterations by a person skilled in the art within the scope of the disclosed technical concept, and it is to be understood that these are naturally within the technical scope of the film-forming apparatus of the invention.

EXAMPLES

Vapor deposition films were actually formed using a film-forming apparatus of the invention as shown in FIG. 1 and a film-forming apparatus of the prior art as a comparative example, and the produced barrier films were evaluated using the criteria listed below.

Example 1

Using a plasma pretreatment device of the invention, plasma was introduced from plasma supply nozzles onto one side of a substrate of PET (by Nan Ya Plastics Corp.) with a thickness of 12 μm and a width of 1000 mm, under the following plasma conditions, for plasma pretreatment of the PET substrate at a conveying speed of 480 m/min, by passing it through plasma at a density of 550 W·sec/m$^2$ in a gap formed by the pretreatment drum, the magnetic field-forming means 21 and the plasma supply nozzles.

Next, on the continuously conveyed substrate in the film formation compartment there was formed a vapor deposited thin-film layer (thickness: 10 nm) made of aluminum oxide, using aluminum metal as the target, by vacuum vapor deposition based on resistance heating.

The plasma pretreatment conditions were as follows.
Plasma Pretreatment Conditions:
  High-frequency power source output: 4 (2+2) kw
  Plasma density (Ed value): 550 W·sec/m$^2$
  Plasma-forming gas: Plasma-forming gas of oxygen 3000 (sccm) and argon gas 1000 (sccm), with introduction of mixed gas of oxygen:argon at 3:1.
  Magnetic field-forming means: 1000 gauss permanent magnet
  Applied voltage between pretreatment drum and plasma supply nozzles: 420 V
  Vacuum Vapor Deposition Conditions
  Vacuum: $2.0 \times 10^{-1}$ Pa
(Evaluation Method)

Using a barrier film produced by a film-forming apparatus, a barrier coat layer was formed on the metal oxide vapor deposition film of the barrier film, and a urethane-based adhesive was used on the barrier coat layer of the laminated film to bond a biaxially stretched polyamide resin as a heat seal layer by a dry laminating method, while unstretched polyethylene was further bonded to the heat seal layer side using a urethane-based adhesive by a dry laminating method, to fabricate a laminated film sample.

Here, the barrier coat layer used had a gas barrier composition obtained by adding a prepared hydrolysate comprising ethyl silicate 40, isopropyl alcohol, acetylacetone aluminum and ion-exchanged water to an EVOH solution comprising EVOH (ethylene copolymerization ratio: 29%) and a mixed solvent of isopropyl alcohol and ion-exchanged water, stirring the mixture, and then further adding a prepared liquid mixture comprising a polyvinyl alcohol aqueous solution, acetic acid, isopropyl alcohol and ion-exchanged water, stirring the mixture, and subjecting the obtained colorless transparent barrier coated film-forming composition to polycondensation by a sol-gel method.

The obtained laminated film was molded into a 4-sided pouch and filled with tap water, and then subjected to hot water recovering retort treatment at 121° C. for 40 minutes.

The values for the water vapor transmittance and laminated strength were measured before retort treatment and after retort treatment, and the presence of any raised sections on the vapor deposition film due to folding of the film was observed.

The performance evaluation results before and after retort treatment are shown in Table 1.

The method of evaluating each performance parameter was as follows.

<Measurement of Water Vapor Transmittance>

This was measured using a water vapor transmittance measuring apparatus (PERMATRAN by Mocon Co.) under measuring conditions of 40° C., 90% RH according to the method of JIS K 7126 B. A water vapor transmittance of 0.5 (g/m$^2$/24 hr) or less for the laminated film was considered to be a practical level.

<Measurement of Laminated Strength>

This was measured by preparing a laminated sample with a vapor deposition film and biaxially stretched polyamide, bonded by dry lamination using a two-pack curable polyurethane-based adhesive on the laminated film, forming it into a pouch, cutting the retort treated laminated film into a 15 mm-wide strip, and using a TENSILON general purpose material testing machine according to JIS K6854-2 to determine the bonding strength at the bonding interface between the vapor deposition film and the biaxially stretched polyamide at a peel rate of 50 mm/min, by 180° peeling (T-peel test).

<Measurement of Wetted Laminated Strength>

This was measured by preparing a laminated sample with a vapor deposition film and biaxially stretched polyamide, bonded by dry lamination using a two-pack curable polyurethane-based adhesive on the laminated film, forming it into a pouch, cutting the retort treated laminated film into a 15 mm-wide strip, and using a TENSILON general purpose material testing machine according to JIS Z6854-2 to determine the bonding strength at the bonding interface between the vapor deposition film and the biaxially stretched polyamide at a peel rate of 50 mm/min, by 180° peeling (T-peel test), with water droplets from a dropper being dropped on the release surface.

<Observation of Raised Sections on the Film by Folding>

The laminated film sample was folded with the evaluation film side as the valley side, anchored to a clip and subjected to retort treatment. After retort treatment, it was restored to room temperature and the presence of any raised sections on the film at the folded locations of the film was observed.

Example 2

Plasma pretreatment was carried out under the same conditions as Example 1, except for using a plasma output of 12 (6+6) kw, to form a vapor deposited thin-film layer (thickness: 10 nm) comprising aluminum oxide by vacuum vapor deposition on the plasma pretreated side.

The evaluation method was the same as in Example 1.

Example 3

Using a plasma pretreatment device of the invention, in the same manner as Example 1, plasma was introduced from plasma supply nozzles onto one side of a substrate of PET (by Nan Ya Plastics Corp.) with a thickness of 12 μm and a width of 1000 mm, under the following plasma conditions, for plasma pretreatment of the PET substrate at a conveying speed of 480 m/min, by passing it through plasma at a density of 550 W·sec/m$^2$ in a gap formed by the pretreatment drum, the magnetic field-forming means 21 and the plasma supply nozzles.

Next, on the continuously conveyed substrate in the film formation compartment there was formed a vapor deposited thin-film layer (thickness: 10 nm) made of aluminum oxide, using aluminum metal as the target, by vacuum vapor deposition based on resistance heating.

The plasma pretreatment conditions were as follows. Plasma pretreatment was carried out under the same conditions as Example 1, with a plasma output of 12 (6+6) kw, and a plasma-forming gas of oxygen 1500 (sccm) and argon 1000 (sccm).

Plasma Pretreatment Conditions:

High-frequency power source output: 12 kw (6+6) kw

Plasma density (Ed value): 550 W·sec/m$^2$

Plasma-forming gas: Plasma-forming gas of oxygen 1500 (sccm) and argon gas 1000 (sccm), with introduction of mixed gas of oxygen:argon at 1.5:1.

Magnetic field-forming means: 1000 gauss permanent magnet

Applied voltage between pretreatment drum and plasma supply nozzles: 420 V

Vacuum Vapor Deposition Conditions

Vacuum: 2.0×10$^{-1}$ Pa

The evaluation method was the same as in Example 1.

Example 4

Plasma pretreatment was carried out in the same manner as Example 3 under the same conditions as Example 1, except for having an output of 12 kw (6+6) and a plasma-forming gas of nitrogen 3000 (sccm) and argon 1000 (sccm), to form a vapor deposited thin-film layer (thickness: 10 nm) comprising aluminum oxide by vacuum vapor deposition on the plasma pretreated side.

The evaluation method was the same as in Example 1.

Example 5

Using a plasma pretreatment device of the invention, plasma was introduced from plasma supply nozzles onto one side of a substrate of PET (by Nan Ya Plastics Corp.) with a thickness of 12 μm and a width of 1000 mm, under the following plasma conditions, for plasma pretreatment of the PET substrate at a conveying speed of 600 m/min, by passing it through plasma at a density of 188 W·sec/m$^2$ in a gap formed by the pretreatment drum, the magnetic field-forming means 21 and the plasma supply nozzles.

Next, on the continuously conveyed substrate in the film formation compartment there was formed a vapor deposited thin-film layer (thickness: 10 nm) made of aluminum oxide, using aluminum metal as the target, by vacuum vapor deposition based on resistance heating.

The evaluation method was the same as in Example 1.

Plasma Pretreatment Conditions:

High-frequency power source output: 1 (1+1) kw

Plasma density (Ed value): 188 W·sec/m$^2$

Plasma-forming gas: Plasma-forming gas of oxygen 3000 (sccm) and argon gas 1000 (sccm), with introduction of mixed gas of oxygen:argon at 3:1.

Magnetic field-forming means: 1000 gauss permanent magnet

Applied voltage between pretreatment drum and plasma supply nozzles: 300 V

Vacuum Vapor Deposition Conditions

Vacuum: $3.3 \times 10^{-1}$ Pa

Example 6

Using a plasma pretreatment device of the invention, plasma was introduced from plasma supply nozzles onto one side of a substrate of PET (by Nan Ya Plastics Corp.) with a thickness of 12 μm and a width of 1000 mm, under the following plasma conditions, for plasma pretreatment of the PET substrate at a conveying speed of 600 m/min, by passing it through plasma at a density of 313 W·sec/m² in a gap formed by the pretreatment drum, the magnetic field-forming means 21 and the plasma supply nozzles.

Next, on the continuously conveyed substrate in the film formation compartment there was formed a vapor deposited thin-film layer (thickness: 10 nm) made of aluminum oxide, using aluminum metal as the target, by vacuum vapor deposition based on resistance heating.

The evaluation method was the same as in Example 1.
Plasma Pretreatment Conditions:
  High-frequency power source output: 3 (1.5+1.5) kw
  Plasma density (Ed value): 313 W·sec/m²
  Plasma-forming gas: Plasma-forming gas of oxygen 3000 (sccm) and argon gas 1000 (sccm), with introduction of mixed gas of oxygen:argon at 3:1.
  Magnetic field-forming means: 1000 gauss permanent magnet
  Applied voltage between pretreatment drum and plasma supply nozzles: 350 V
  Vacuum Vapor Deposition Conditions
  Vacuum: $2.9 \times 10^{-1}$ Pa

Example 7

Using a plasma pretreatment device of the invention, plasma was introduced from plasma supply nozzles onto one side of a substrate of PET (by Nan Ya Plastics Corp.) with a thickness of 12 μm and a width of 1000 mm, under the following plasma conditions, for plasma pretreatment of the PET substrate at a conveying speed of 600 m/min, by passing it through plasma at a density of 1824 W·sec/m² in a gap formed by the pretreatment drum, the magnetic field-forming means 21 and the plasma supply nozzles.

Next, on the continuously conveyed substrate in the film formation compartment there was formed a vapor deposited thin-film layer (thickness: 10 nm) made of aluminum oxide, using aluminum metal as the target, by vacuum vapor deposition based on resistance heating.

The evaluation method was the same as in Example 1.
Plasma Pretreatment Conditions:
  High-frequency power source output: 16 (8+8) kw
  Plasma density (Ed value): 1824 W·sec/m²
  Plasma-forming gas: Plasma-forming gas of oxygen 3000 (sccm) and argon gas 1000 (sccm), with introduction of mixed gas of oxygen:argon at 3:1.
  Magnetic field-forming means: 1000 gauss permanent magnet
  Applied voltage between pretreatment drum and plasma supply nozzles: 910 V
  Vacuum Vapor Deposition Conditions
  Vacuum: $2.3 \times 10^{-1}$ Pa Next, film formation was carried out using a film-forming apparatus of prior art, as a comparative example, and the produced barrier films were evaluated using the same criteria as for the invention.

Comparative Example 1

A vapor deposited thin-film layer made of aluminum oxide was formed by vacuum vapor deposition (thickness: 10 nm) on the pretreated surface, under the same conditions as the examples, except that only oxygen gas was used as the plasma-forming gas for the plasma pretreatment with the plasma pretreatment device of the invention, without using argon gas as an inert gas component.

The evaluation method was the same as in Example 1.

Comparative Example 2

A vapor deposited thin-film layer (thickness: 10 nm) made of aluminum oxide was formed by vacuum vapor deposition on the pretreated surface under the same conditions as the examples, except that pretreatment was carried out by reactive ion etching (RIE) utilizing plasma, instead of the plasma pretreatment device of the invention.

The evaluation method was the same as in Example 1.
RIE Treatment Conditions
  Plasma output: 4 kw
  Plasma-forming gas: Argon gas

TABLE 1

| Examples | Water vapor transmittance (g/m² · 24 h) | | Laminated strength (N/15 mm) | | Folding Presence of raised sections |
|---|---|---|---|---|---|
| | Before retort | After retort | Normal peeling | Wetted peeling | |
| Example 1 | 0.2 | 0.8 | 5.9 | 3.6 | − |
| Example 2 | 0.3 | 0.8 | 3.5 | 2.8 | − |
| Example 3 | 0.3 | 0.8 | 4.2 | 2.4 | − |
| Example 4 | 0.5 | 1.5 | 3.9 | 2.1 | − |
| Example 5 | 0.3 | 0.8 | 5.2 | 2.5 | − |
| Example 6 | 0.2 | 0.7 | 6.5 | 3.2 | − |
| Example 7 | 0.4 | 0.8 | 5.4 | 3.8 | − |
| Comp. Ex. 1 | 0.7 | 1.7 | 6.7 | 0.1 | + |
| Comp. Ex. 2 | 0.6 | 1.3 | 3.6 | 1.6 | − |

As shown in Table 1, based on comparison of Example 1 and Comparative Example 2, the barrier films produced using the plasma pretreatment device of the invention had low water vapor transmittance and high laminated strength before and after retort treatment, without raised sections on the film by folding, and the continuous vapor deposition film-forming apparatus comprising a plasma pretreatment device of the invention produced a barrier film with improved performance by vapor deposition film-forming treatment, with notably superior production efficiency.

When the film-forming apparatus of the invention is compared with the comparative example of the prior art, it is seen that with a film-forming apparatus according to the invention as shown in FIG. 1, the discharge voltage is reduced, discharge is more easily stabilized, adhesiveness between the substrate and vapor deposition film is improved and a high-quality, homogeneous vapor deposition film can be formed.

Furthermore, according to the invention, when the 2p energy level of aluminum was measured in the film thickness direction of the substrate on which the vapor deposition film had been formed, and the peak value near 80 (CPS) and the peak value near 60 were connected with a straight line and the bond energies compared, it exceeded 76 (eV) with plasma pretreatment but was 75.5 (eV) in the case of an untreated sample without plasma pretreatment, and therefore a clear difference in energy levels emerged. A bond energy of 76 (eV) or greater as the effect of treatment was evaluated as being a significant pretreatment effect.

Also, even with low electric power introduced during plasma pretreatment, it can be effectively used for adhesion and film formation of the vapor deposition material with a film-forming roller, and it was therefore judged that effective surface modification of the substrate and improved power efficiency had been achieved, and it was further judged that the film-forming speed of the vapor deposition film was improved, a film with excellent vapor deposition film density, i.e. excellent vapor deposition film denseness, had been formed, and that film products with excellent barrier properties can be produced at high speed.

INDUSTRIAL APPLICABILITY

The invention relates to a continuous vapor deposition film-forming apparatus that can carry out plasma pretreatment homogeneously over a large area on a long substrate surface under reduced pressure, and can form a homogeneous vapor deposition film having a highly active surface and increased adhesiveness, being applicable for both physical vapor deposition and chemical vapor deposition for high-speed formation, and it can be applied for production of a barrier film and a layered material employing it, as well as a packaging material having a barrier property that prevents permeation of oxygen gas, water vapor or the like and especially having an excellent water vapor barrier property as well as excellent adhesiveness of the layered material, that can withstand, for example, the heat treatment conducted during processing in retort treatment and the like.

EXPLANATION OF SYMBOLS

1 Roller-type continuous vapor deposition film-forming apparatus
S substrate
P Plasma
12 Pressure reduction chamber
12A Substrate conveying compartment
12B plasma pretreatment compartment
12C Film formation compartment
13 Wind-out roller
14 Guide roller
15 Take-up roller
18 Source gas volatilizing and supply apparatus
19 Source gas-supply nozzle
20 Pretreatment roller
21 Magnet
22 Plasma supply nozzle
25 Film-forming roller
26 Vapor deposition film-forming means
30 Vacuum pump
31 Power supply wiring
32 Power source
35a-35c Partitions

The invention claimed is:

1. A method for forming a laminated film on a substrate, the method comprising:
   i) providing a film forming apparatus comprising:
      a substrate conveying compartment,
      a plasma pretreatment compartment, and
      a vapor deposition compartment,
         wherein a pulse voltage of 200 volts to 1000 volts is applied to a power source of the film forming apparatus;
   ii) conveying the substrate from the substrate conveying compartment into the plasma pretreatment compartment at a conveying speed of from 480 m/min to 1000 m/min;
   iii) performing plasma pretreatment on the substrate in the plasma pretreatment compartment to produce a plasma pretreated substrate,
   wherein the plasma pretreatment compartment has a maintained pretreatment pressure of 0.1 Pa to 100 Pa,
   wherein the plasma pretreatment comprises:
      a) supplying a plasma source gas from a plasma-supply nozzle as plasma into a gap between a magnet and a pretreatment roller such that the plasma is entrapped in the gap,
      wherein the plasma source gas comprises argon and at least one additional gas selected from the group consisting of oxygen, nitrogen, carbon dioxide gas, and ethylene,
         wherein the plasma source gas has a mixing ratio of the at least one additional gas:the argon of 1.5:1 to 3:1, and
      wherein the magnet has a flux density of 100 gauss to 10,000 gauss, and
      b) holding the plasma and applying a voltage between the pretreatment roller and the plasma-supply nozzle
      wherein the plasma has a plasma density of 100 W·sec/m$^2$ to 1824 W·sec/m$^2$, and
      wherein the voltage is applied as an alternating current voltage with a frequency of 10 Hz to 50 MHz;
   iv) conveying the plasma pretreated substrate from the plasma pretreatment compartment into the vapor deposition compartment by a film-forming roller at a conveying speed of from 480 m/min to 1000 m/min;
   v) forming a vapor deposition film by vapor deposition on a surface of the plasma pretreated substrate that was pretreated in step iii),
   wherein the vapor deposition film has a thickness of 10 to 50 nm;
   wherein steps i) to v) proceed continuously,
   vi) forming a barrier coat layer on a surface of the vapor deposition film that was formed in step v) to obtain a laminated film,
   wherein the barrier coat layer is formed by applying a composition for barrier coating film and polymerizing the composition by a sol-gel method,
      wherein the composition is obtained by:
         1) obtaining a gas barrier composition comprising silicon alkoxide, isopropyl alcohol, and ion exchanged water; and then
         2) adding to the gas barrier composition a prepared liquid mixture comprising a polyvinyl alcohol aqueous solution, isopropyl alcohol and ion exchanged water; and
   vii) retorting the laminated film that was obtained in step vi) with hot water for 40 minutes at 121° C.,
      wherein, after retorting,
         under measurement conditions of 40° C. and 90% RH, a water vapor transmission rate of the laminated film is 0.8 g/m$^2$/24 h or less, and
         a water-applied laminate strength of the laminated film, measured in accordance with JIS Z6854-2, is 2.1 N/15 mm or more, and
      wherein the substrate conveying compartment has a maintained pressure that is 10 to 10,000 times greater than the maintained pretreatment pressure.

2. The method according to claim 1, wherein the vapor deposition film is formed by a physical vapor deposition selected from the group consisting of sputtering, ion plating, ion beam assist film forming, and cluster ion beam film forming.

3. The method according to claim 1, wherein the film-forming roller has a constant temperature between −20° C. and 200° C.

4. The method according to claim 1, further comprising
iii-1) before step vi), performing plasma post-treatment of the plasma pretreated substrate comprising removing charge from the substrate.

5. The method according to claim 1, wherein a pressure reduction degree of the plasma pretreatment compartment is up to $9.0 \times 10^{-5}$ Pa.

6. The method according to claim 1, wherein the substrate has a thickness of 6 μm to 100 μm.

7. The method according to claim 1, wherein the pretreatment roller has a constant temperature between −20° C. and 100° C.

8. The method according to claim 1, wherein the pretreatment roller has a potential set at an electrical floating level.

9. The method according to claim 1, wherein the substrate has an area of 1 m² or greater.

\* \* \* \* \*